(12) United States Patent
Wang et al.

(10) Patent No.: US 11,594,589 B2
(45) Date of Patent: Feb. 28, 2023

(54) DISPLAY SUBSTRATE INCLUDING CRACK DETECTION LINE AND CRACK STOPPER AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Ge Wang, Beijing (CN); Zhiliang Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 851 days.

(21) Appl. No.: 16/476,387

(22) PCT Filed: Dec. 14, 2018

(86) PCT No.: PCT/CN2018/121113
§ 371 (c)(1),
(2) Date: Jul. 8, 2019

(87) PCT Pub. No.: WO2019/169924
PCT Pub. Date: Sep. 12, 2019

(65) Prior Publication Data
US 2021/0359069 A1 Nov. 18, 2021

(30) Foreign Application Priority Data
Mar. 5, 2018 (CN) .......................... 201810180049.8

(51) Int. Cl.
H01L 27/32 (2006.01)
H01L 51/52 (2006.01)

(52) U.S. Cl.
CPC ...... *H01L 27/3276* (2013.01); *H01L 27/3258* (2013.01); *H01L 51/5253* (2013.01)

(58) Field of Classification Search
CPC ............. H01L 27/3276; H01L 27/3258; H01L 51/5253; H01L 51/0096–0097
See application file for complete search history.

(56) References Cited

U.S. PATENT DOCUMENTS 10,026,793 B2 7/2018 Jeon et al.
2016/0293884 A1 10/2016 Zhang et al.
(Continued)

FOREIGN PATENT DOCUMENTS

CN 106057853 A 10/2016
CN 106098724 A 11/2016
(Continued)

OTHER PUBLICATIONS

Extended European Search Report from European Patent Application No. 18897860.5 dated Nov. 24, 2021.
(Continued)

*Primary Examiner* — Steven B Gauthier
*Assistant Examiner* — Candice Chan
(74) *Attorney, Agent, or Firm* — Dilworth & Barrese, LLP.; Michael J. Musella, Esq.

(57) ABSTRACT

A display substrate and a display device are disclosed. The display substrate includes a base substrate, an insulating layer, a first crack stopper, and a first crack detection line. The base substrate includes a display region and a non-display region. The insulating layer is located on the base substrate. The first crack stopper is located in the non-display region and is configured to block the first crack in the insulating layer from extending towards the display region. The first crack detection line is located in the non-display region, an edge of the orthographic projection of the first (Continued)

crack stopper on the base substrate close to the display region is a blocking edge, and the orthographic projection of the first crack detection line on the base substrate is located at a side of the orthographic projection of the first crack stopper on the base substrate away from the blocking edge.

17 Claims, 8 Drawing Sheets

(56) References Cited

U.S. PATENT DOCUMENTS

2016/0307971 A1* 10/2016 Jeon .................. G09G 3/3233
2016/0315284 A1   10/2016 Jeon
2017/0263880 A1    9/2017 Lee et al.

FOREIGN PATENT DOCUMENTS

| CN | 107255655 A   | 10/2017 |
| CN | 107464512 A   | 12/2017 |
| WO | 2016160693 A1 | 10/2016 |
| WO | 20160307971 A1| 10/2016 |

OTHER PUBLICATIONS

International Search Report and Written Opinion dated Feb. 28, 2019.
First Chinese Office Action from Chinese Patent Application No. 20180180049 dated Dec. 11, 2020.

* cited by examiner

DISPLAY SUBSTRATE INCLUDING CRACK DETECTION LINE AND CRACK STOPPER AND DISPLAY DEVICE

This application claims priority to Chinese patent application No. 201810180049.8 filed on Mar. 5, 2018, the disclosure of which is incorporated herein by reference in its entirety as part of this application.

TECHNICAL FIELD

At least one embodiment of the present disclosure relates to a display substrate and a display device.

BACKGROUND

Generally, an organic light-emitting diode (OLED) display substrate includes an inorganic layer, an edge of which is prone to generate a crack. If the edge crack extends to the display region, a defect such a black spot will easily occur.

SUMMARY

At least one embodiment of the present disclosure provides a display substrate, the display substrate comprises: a base substrate, including a display region and a non-display region that is located at at least one side of the display region; an insulating layer located on the base substrate; a first crack stopper, located in the non-display region and configured to block the first crack in the insulating layer from extending towards the display region; a packaging film; a second crack stopper located in the non-display region; and a crack detection line located in the non-display region, wherein the edge of the orthographic projection of the first crack stopper on the base substrate close to the display region is a blocking edge, the orthographic projection of the crack detection line on the base substrate is located at a side of the orthographic projection of the first crack stopper on the base substrate away from the blocking edge, and/or is located between the orthographic projection of the first crack stopper on the base substrate and the orthographic projection of the second crack stopper on the base substrate and between the packaging film and the insulating layer.

At least one embodiment of the present disclosure provides a display substrate, the display substrate comprises: a base substrate including a display region and a non-display region that is located at at least one side of the display region; an insulating layer located on the base substrate; a first crack stopper located in the non-display region and configured to block the first crack in the insulating layer from extending towards the display region; and a first crack detection line located in the non-display region, wherein the edge of the orthographic projection of the first crack stopper on the base substrate close to the display region is a blocking edge, and the orthographic projection of the first crack detection line on the base substrate is located at a side of the orthographic projection of the first crack stopper on the base substrate away from the blocking edge.

For example, in the display substrate provided by an embodiment of the present disclosure, the first crack detection line is located at a position of at least one of at a side of the first crack stopper away from the display region and directly below the first crack stopper.

For example, in the display substrate provided by an embodiment of the present disclosure, the first crack detection line includes a plurality of first crack sub-detection lines insulated from each other.

For example, in the display substrate provided by an embodiment of the present disclosure, one portion of the plurality of first crack sub-detection lines is located at a side of the first crack stopper away from the display region, and the orthographic projection of another portion of the plurality of first crack sub-detection lines on the base substrate falls into the orthographic projection of the first crack stopper on the base substrate.

For example, in the display substrate provided by an embodiment of the present disclosure, the plurality of first crack sub-detection lines are located at a side of the first crack stopper away from the display region.

For example, in the display substrate provided by an embodiment of the present disclosure, the orthographic projection of the plurality of first crack sub-detection lines on the base substrate falls into the orthographic projection of the first crack stopper on the base substrate.

For example, in the display substrate provided by an embodiment of the present disclosure, the first crack stopper is formed in the insulating layer.

For example, in the display substrate provided by an embodiment of the present disclosure, the first crack stopper includes at least one groove running through at least a portion of the insulating layer in a direction perpendicular to the base substrate.

For example, in the display substrate provided by an embodiment of the present disclosure, the first crack stopper includes a plurality of grooves, and the first crack stopper further includes a retaining wall located between adjacent grooves.

For example, in the display substrate provided by an embodiment of the present disclosure, the orthographic projection of the first crack sub-detection line on the base substrate falls into the orthographic projection of the retaining wall on the base substrate.

For example, in the display substrate provided by an embodiment of the present disclosure, the first crack sub-detection line is located between the insulating layer and the base substrate.

For example, in the display substrate provided by an embodiment of the present disclosure, the insulating layer includes a plurality of sub-insulating layers, and the first crack sub-detection line is located between the plurality of sub-insulating layers.

For example, in the display substrate provided by an embodiment of the present disclosure, the plurality of sub-insulating layers include at least one of a first gate insulating layer, a second gate insulating layer, and an interlayer insulating layer.

For example, in the display substrate provided by an embodiment of the present disclosure, the first crack detection line is in contact with the insulating layer.

For example, the display substrate provided by an embodiment of the present disclosure further includes a packaging film and a second crack stopper that is located in the non-display region; the packaging film is located at a side of the insulating layer away from the base substrate and at least covers the display region; the second crack stopper is configured to block the second crack in the packaging film from extending towards the display region; and the second crack stopper is located at a side of the first crack stopper close to the display region.

For example, the display substrate provided by an embodiment of the present disclosure further includes a second crack detection line, wherein the orthographic projection of the second crack detection line on the base substrate is located between the orthographic projection of the first crack stopper on the base substrate and the orthographic projection of the second crack stopper on the base substrate.

For example, in the display substrate provided by an embodiment of the present disclosure, the second crack detection line is located between the packaging film and the insulating layer.

For example, in the display substrate provided by an embodiment of the present disclosure, the second crack detection line is covered by the packaging film.

For example, in the display substrate provided by an embodiment of the present disclosure, at least one of the first crack detection line and the first crack stopper is not covered by the packaging film.

For example, in the display substrate provided by an embodiment of the present disclosure, the second crack detection line includes a plurality of second crack sub-detection lines insulated from each other, and the second crack detection line is in contact with the packaging film.

For example, in the display substrate provided by an embodiment of the present disclosure, the packaging film includes a plurality of sub-packaging films, and the second crack detection line is located between the plurality of sub-packaging films.

At least one embodiment of the present disclosure further provides a display device, including the display substrate of any one of the above.

At least one embodiment of the present disclosure further provides a method of manufacturing a display substrate, comprising: forming an insulating layer on a base substrate, wherein the base substrate comprises a display region and a non-display region that is located at at least one side of the display region; forming a first crack stopper in the non-display region, wherein the first crack stopper is configured to block a first crack in the insulating layer from extending towards the display region; and forming a first crack detection line in the non-display region, wherein an edge of an orthographic projection of the first crack stopper on the base substrate close to the display region is a blocking edge, and the orthographic projection of the first crack detection line on the base substrate is located at a side of an orthographic projection of the first crack stopper on the base substrate away from the blocking edge.

At least one embodiment of the present disclosure further provides a method of detecting the display substrate, comprising: detecting whether there is the first crack in the display substrate through the first crack detection line.

At least one embodiment of the present disclosure further provides a method of detecting the display substrate, comprising: detecting whether there is the first crack in the display substrate through the first crack detection line, detecting whether there is the second crack in the display substrate through the second crack detection line, and grading the crack degree of the display substrate through the detection results of the first crack and the second crack.

For example, in the method of detecting the display substrate provided by an embodiment of the present disclosure, the first crack detection line includes a plurality of first crack sub-detection lines insulated from each other; a portion of the plurality of first crack sub-detection lines is located at a side of the first crack stopper away from the display region, and an orthographic projection of another portion of the plurality of first crack sub-detection lines on the base substrate falls into an orthographic projection of the first crack stopper on the base substrate; the detection method comprises: detecting whether there is the first crack in the display substrate through the plurality of first crack sub-detection lines, to obtain the extension degree of the first crack.

BRIEF DESCRIPTION OF THE DRAWINGS

In order to explain the technical solutions exemplified by the present disclosure more clearly, the drawings of the examples will be briefly introduced below. It is obvious that the drawings described below only refer to some examples of the present disclosure and are not limitative of the present disclosure.

DETAILED DESCRIPTION

In order to make the objects, technical solutions and advantages of the embodiments of the present disclosure clearer, the technical solutions of the examples of the present disclosure will be described clearly and completely with reference to the drawings of the examples of the present disclosure. Apparently, the described examples are just part but not all of the examples of the present disclosure. Based on the examples described herein, all the other examples obtained by a person of ordinary skill in the art without any inventive work should be within the scope of protection of the present disclosure.

Unless otherwise defined, the technical or scientific terms used in the present disclosure shall have the meanings as commonly understood by one of ordinary skill in the art to which the present disclosure belongs. The terms "first," "second," and the like which are used in the present disclosure are not intended to indicate any sequence, amount or importance, but to distinguish various components. Likewise, the terms "comprise," "comprising," "include,"

"including," and the like are intended to specify that the elements or objects stated before these terms encompass the elements or objects and equivalents thereof listed after these terms, and do not preclude the other elements or objects. The terms "connect", "connected", and the like are not intended to define physical or mechanical connection, but may include electrical connection, either directly or indirectly. "On," "below," "left," "right" and the like are only used to indicate a relative position relationship, and if the absolute position of the object described is changed, the relative position relationship may be changed accordingly.

Figure 1:
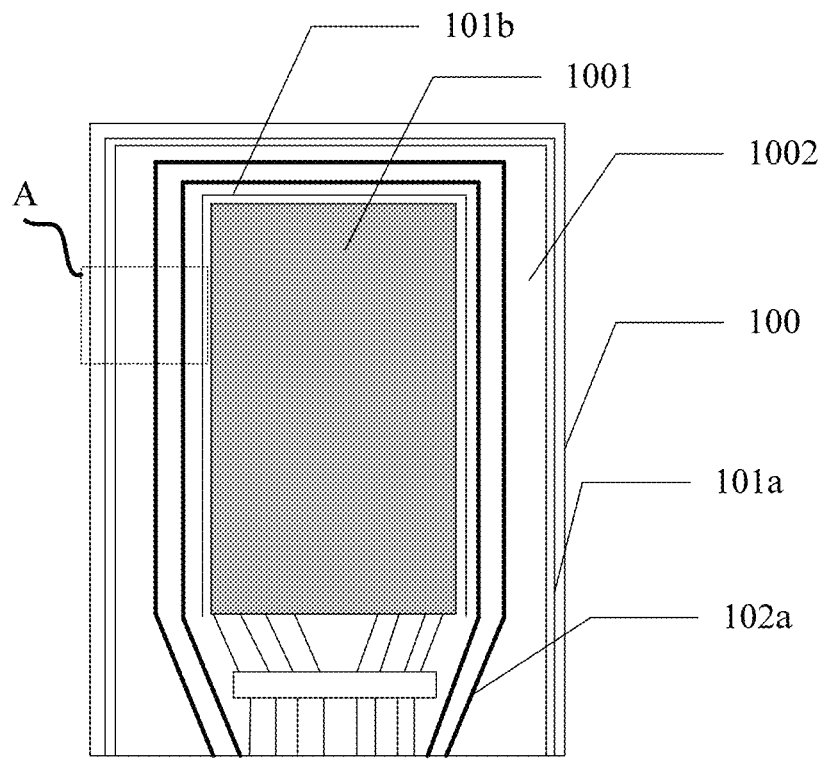
FIG. 1 is a schematic plan view of a display substrate.

FIG. 1 is a schematic plan view of a display substrate. As shown in FIG. 1, the display substrate includes a base substrate 100, which is divided into two regions. For example, the base substrate 100 includes a display region 1001 and a non-display region 1002 that is located at at least one side of the display region 1001. For example, the non-display region 1002 may be located at at least one of an upper side, a lower side, a left side, and a right side of the display region 1001. FIG. 1 illustrates that the non-display region 1002 is located at the upper, lower, left and right sides of the display region 1001. For example, the non-display region 1002 may be located only at one side of the display region 1001, for example, only at the upper side, lower side, left side or right side of the display region 1001. In FIG. 1, a gray filled region is a display region 1001, and a remaining region of the base substrate 100 is a non-display region 1002. For example, the display region 1001 is a picture display region of the display substrate and is a light-exiting region. For example, the non-display region 1002 is a region of the display substrate where a picture is not displayed and is a non-light-exiting region.

As shown in FIG. 1, in the non-display region 1002, a first crack stopper 101a is disposed to block an edge crack from extending to the display region 1001. In the non-display region 1002, a first crack detection line 102a configured to detect a first crack is further provided. If the first crack is detected out through the first crack detection line 102a, then products with edge cracks can be prevented from flowing into the client terminal. For example, an edge of a layer, such as an inorganic layer, on the base substrate 100 may suffer from a first crack when the display substrate motherboard is cut into a plurality of individual display substrates, during transportation, or when the display substrate is subjected to mechanical shock or thermal shock.

Figure 2:
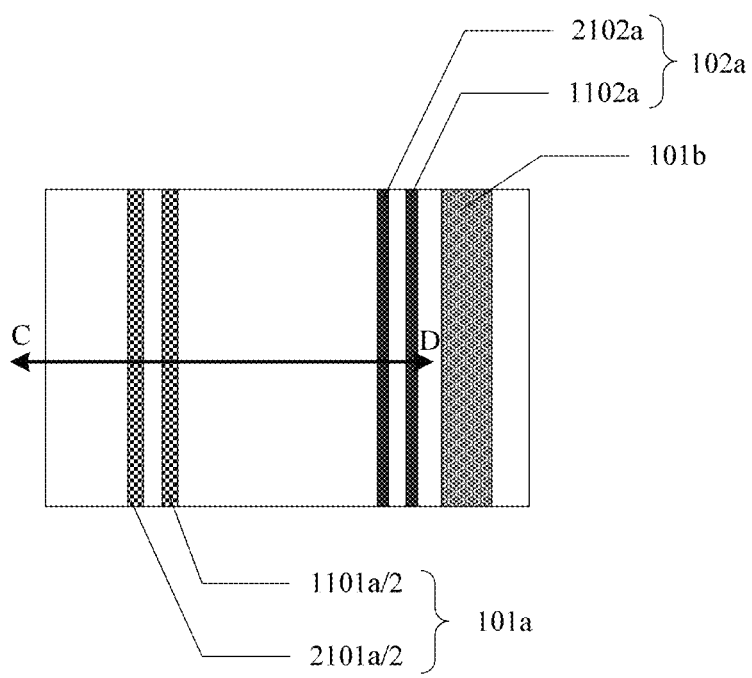
FIG. 2 is a schematic enlarged view at a dotted box A in FIG. 1.

FIG. 2 is a schematic enlarged view at a dotted box A in FIG. 1. As shown in FIG. 2, the first crack stopper 101a includes two first crack sub-stoppers 1101a, 2101a. The first crack detection line 102a includes two first crack sub-detection lines 1102a, 2102a insulated from each other. For example, the first crack stopper 101a may include at least one first crack sub-stopper, and the case where two first crack sub-stoppers 1101a and 1101b are included is taken as an example in examples of the present disclosure. For example, the first crack detection line 102a may include at least one first crack sub-detection line, and the case where two first crack sub-detection lines are included is taken as an example in this example. When the first crack detection line 102a includes a plurality of first crack sub-detection lines, the plurality of first crack sub-detection lines are insulated from each other, to facilitate detection of crack extension degree.

As shown in FIG. 2, the display substrate 101b further includes a second crack stopper 101b (see also FIG. 1). The first crack detection line 102a is located outside the second crack stopper 101b. For example, the first crack detection line 102a is located at a side of the second crack stopper 101b away from the display region 1001. Further, for example, the first crack detection line 102a is located between the second crack stopper 101b and the first crack stopper 101a.

Figure 3A:
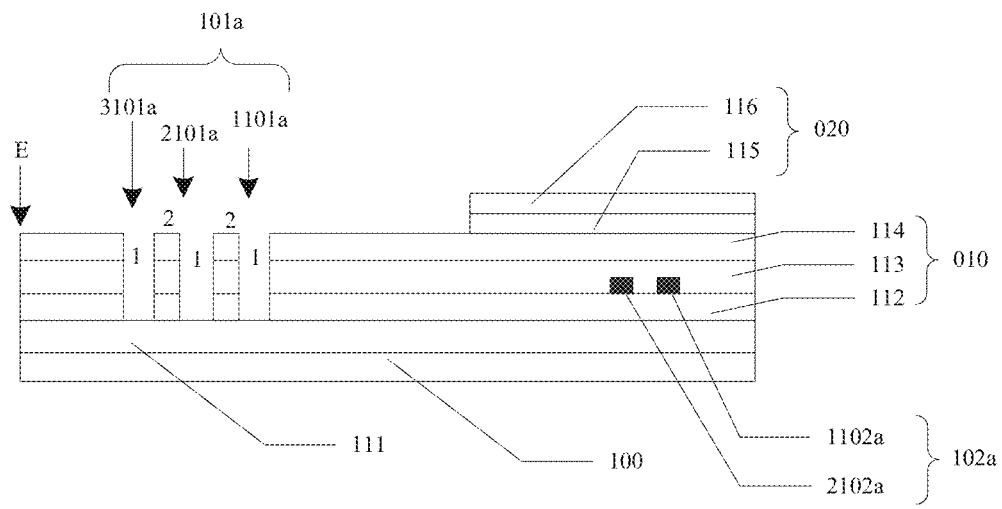
FIG. 3A is a schematic cross-sectional view at CD in FIG. 2.

FIG. 3A is a schematic cross-sectional view at CD in FIG. 2. The display substrate includes a buffer layer 111, an insulating layer 010, and a packaging film 020 which are disposed on the base substrate 100. For example, the insulating layer 010 includes at least one of a first gate insulating layer 112, a second gate insulating layer 113, and an interlayer dielectric layer 114. In examples of the present disclosure, the case where the insulating layer 010 includes the first gate insulating layer 112, the second gate insulating layer 113, and the interlayer dielectric layer 114 is taken as an example. The first crack stopper 101a may include at least one first crack sub-stopper. Each first crack sub-stopper includes at least one groove 1 running through at least a portion of the insulating layer in a direction perpendicular to the base substrate 100. For example, a portion of the insulating layer between adjacent grooves 1 is a retaining wall 2. For example, in the examples of the present disclosure, the first crack stopper 101a may include at least one groove 1. FIG. 3A illustrate three first crack sub-stoppers. The first crack sub-stoppers 1101a, 2101a may include one groove 1 and one retaining wall 2, respectively. The first crack sub-stopper 3101a includes one groove 1. In some examples, the first crack stopper 101a includes at least one groove 1 and at least one retaining wall 2. For example, in FIG. 2, the first crack sub-stoppers 1101a and 1101b are shown with the retaining wall 2.

As shown in FIG. 3A, the packaging film 020 may include a plurality of sub-packaging films, for example, a first inorganic film 115 and a second inorganic film 116. The packaging film 020 will be described in detail in the following examples.

As shown in FIG. 3A, the first crack detection line 102a may be covered by a packaging film 020. For example, the first crack detection line 102a is covered by the first inorganic packaging film 115 and the second inorganic packaging film 116 which are laminated in contact in the packaging film 020. For example, the first crack detection line 102a may overlap with the packaging film 020 in a direction perpendicular to the base substrate 100. Further, for example, in a direction perpendicular to the base substrate 100, the first crack detection line 102a may overlap with the first inorganic packaging film 115 and the second inorganic packaging film 116 of the packaging film 020 which are laminated in contact and close to an edge of the base substrate 100.

Figure 3B:
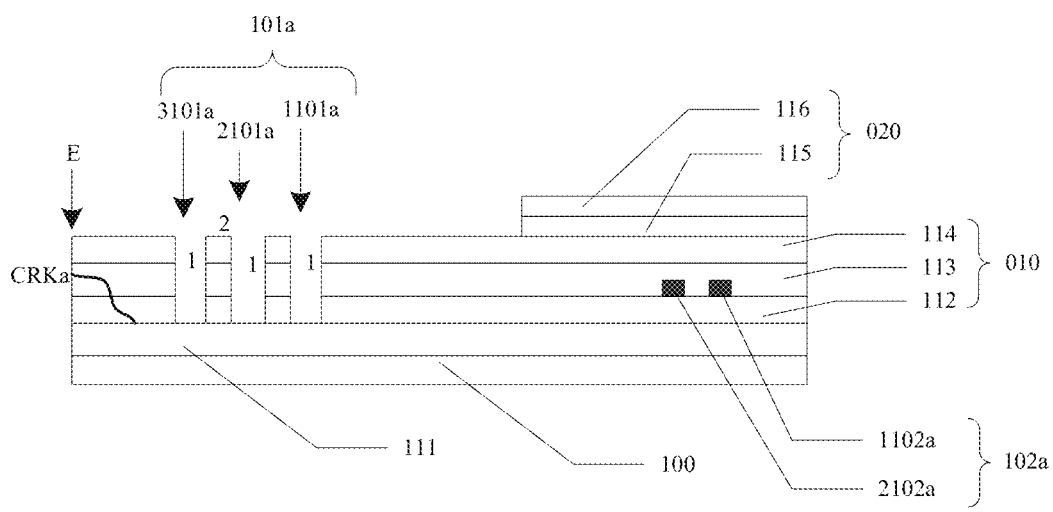
FIG. 3B is a schematic cross-sectional view of a display substrate containing a first crack.

FIG. 3B is a schematic view of a display substrate containing a first crack. As shown in FIG. 3B, the first crack stopper 101a is close to an edge E of the base substrate 100 and is configured to block the first crack CRKa in the insulating layer 010 from extending to the display region 1001. In general, although the first crack stopper 101a is provided, which can block the first crack CRKa in the insulating layer 010 from extending to the display region 1001 to some extent, cracks still cannot be completely blocked, and there may still be cracks which can extend towards the display region 1001 across the first crack stopper 101a.

If the first crack is detected by forming a first crack detection line 102a outside the second crack stopper 101b, then only the first crack travelling to the position of the second crack stopper 101b can be detected, and an edge microcracks cannot be detected. Because the edge microcracks will grow inward all the time, if they travel to the display region in the subsequent use process, a defect such as a black spot will be caused.

The embodiments of the present disclosure provide a display substrate, manufacturing and detecting methods thereof, and a display device. The display substrate includes: a base substrate, including a display region and a non-display region that is located at at least one side of the display region; an insulating layer located on the base substrate; a first crack stopper located in the non-display region and configured to block the first crack in the insulating layer from extending to the display region; and a first crack detection line located in the non-display region, wherein an edge of an orthographic projection of the first crack stopper on the base substrate close to the display region is a blocking edge, and the orthographic projection of the first crack detection line on the base substrate is located at a side of an orthographic projection of the first crack stopper on the base substrate away from the blocking edge.

Figure 4:
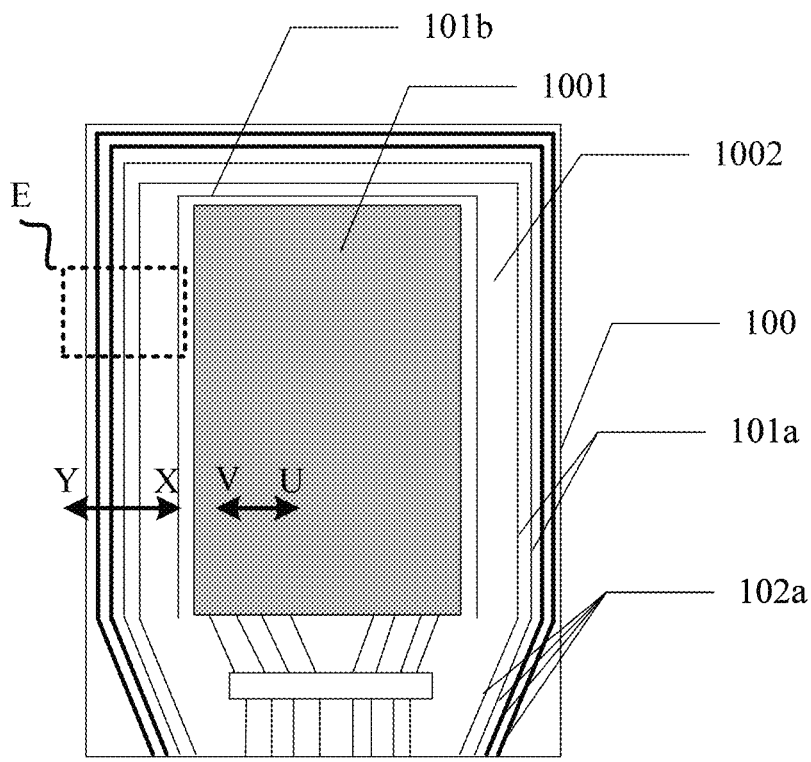
FIG. 4 is a schematic plan view of a display substrate provided by at least one example of the present disclosure.

FIG. 4 is a schematic plan view of a display substrate provided by at least one example of the present disclosure. As shown in FIG. 4, in the display substrate, a position of the first crack detection line 102a is adjusted, so that the first crack detection line 102a is located at a position of at least one of at a side of the first crack stopper 101a away from the display region 1001 and directly below the first crack stopper 101a. That is, the first crack detection line 102a may be located at a side of the first crack stopper 101a away from the display region 1001, and/or directly below the first crack stopper 101a. The first crack detection line 102a is located in the non-display region 1002. In other words, an edge of an orthographic projection of the first crack stopper 101a on the base substrate 100 close to the display region 1001 is a blocking edge (inside edge), and the orthographic projection of the first crack detection line 102a on the base substrate 100 is located at a side of an orthographic projection of the first crack stopper 101a on the base substrate 100 away from the blocking edge. For example, "directly below the first crack stopper 101a" may refer to "in a direction perpendicular to the base substrate", and the projection of the first crack detection line 102a on the base substrate is located within the projection of the first crack stopper 101a on the base substrate 100 in a direction perpendicular to the base substrate 100. Of course, embodiments of the present disclosure include but are not limited to this, and the first crack detection line 102a may also be located above the first crack stopper 101a.

According to the display substrate provided by at least one example of the present disclosure, a first crack detection line 102a is formed at a side of the first crack stopper 101a away from the display region 1001 and/or directly below the first crack stopper 101a, which can detect a microcrack at an edge of the display substrate, effectively prevent missed detection, and prevent products with an edge crack from flowing into the client terminal.

As shown in FIG. 4, in one or more examples, the display substrate includes a base substrate 100 and a first crack stopper 101a that is disposed on the base substrate 100. The base substrate 100 includes a display region 1001 and a non-display region 1002 that is located at at least one side of the display region 1001. The first crack stopper 101a is located in the non-display region 1002 and is close to an edge of the base substrate 100.

As shown in FIG. 4, in one or more examples, the display substrate further includes a second crack stopper 101b located in the non-display region 1002. The first crack detection line 102a is located at a side of the second crack stopper 101 away from the display region 1001. In one or more examples, the second crack stopper 101b is located at a side of the first crack stopper 101a close to the display region 1001.

Figure 5:
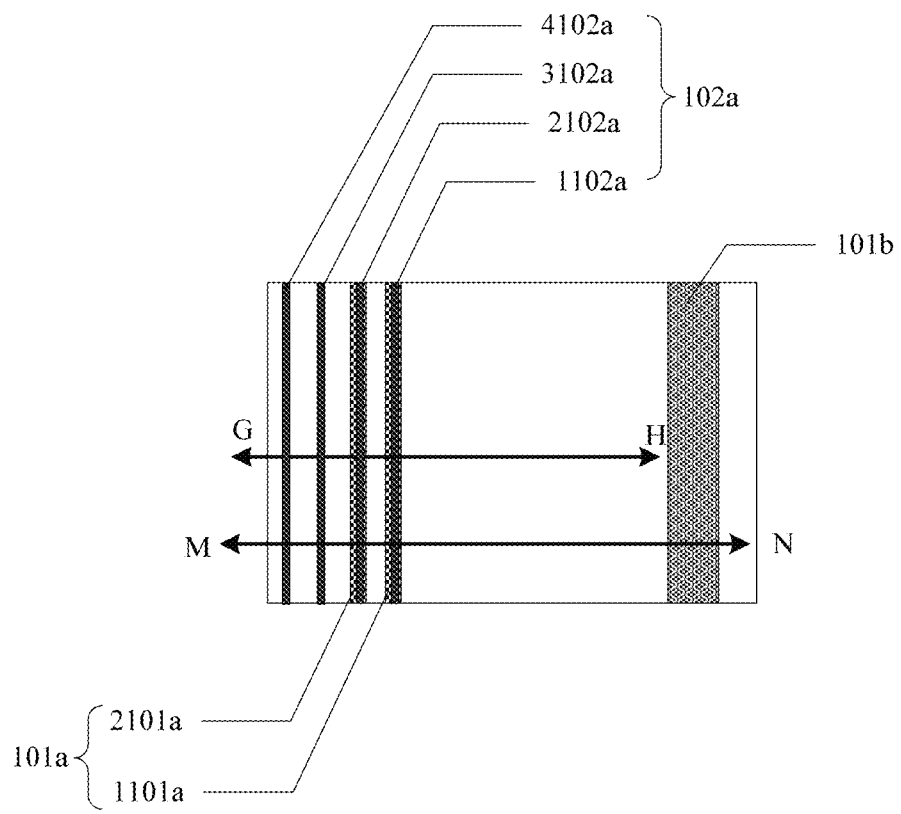
FIG. 5 is a schematic enlarged view inside a dotted box E in FIG. 4.

FIG. 5 is a schematic enlarged view of a dotted box E in FIG. 4. As shown in FIG. 5, a first crack detection line 102a is provided directly below the first crack stopper 101a and at a side of the first crack stopper 101a away from the display region 1001. The first crack detection line 102a may include a plurality of first crack sub-detection lines insulated from each other. FIG. 5 illustrates four first crack sub-detection lines 1102a, 2102a, 3102a and 4102a. One portion of the plurality of first crack sub-detection lines is located at a side of the first crack stopper away from the display region, and an orthographic projection of another portion of the plurality of first crack sub-detection lines on the base substrate falls into an orthographic projection of the first crack stopper on the base substrate. Whether there is a first crack in the display substrate is detected through the plurality of first crack sub-detection lines, and the degree of extension of the first crack can also be obtained.

For example, the first crack detection line 102a includes at least two first crack sub-detection lines respectively located at a side of the first crack stopper 101a away from the display region 1001 and directly below the first crack stopper 101a. The degree of extension of the first crack can be obtained by detecting whether there is the first crack in the display substrate through the at least two first crack sub-detection lines. For example, the first crack stopper 101a includes a plurality of first crack sub-stoppers, and two first crack sub-stoppers 1101a and 2101a are shown in FIG. 5.

The base substrate 100, the display region 1001, the non-display region 1002, and the first crack stopper 101a may be described with reference to the previous description and will not be further described herein.

Figure 6A:
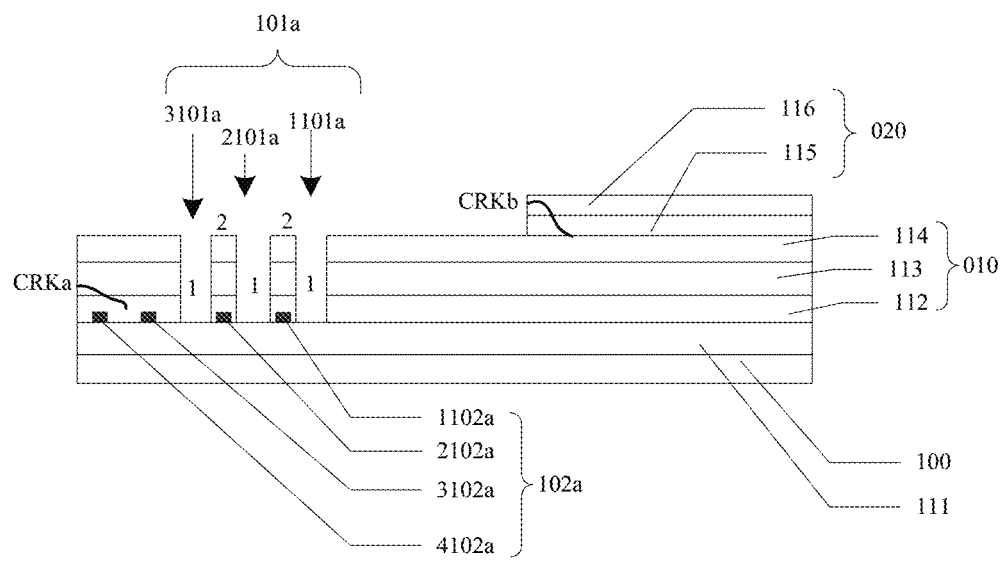
FIG. 6A is a schematic cross-sectional view at GH in FIG. 5.

FIG. 6A is a schematic cross-sectional view at GH in FIG. 5. As shown in FIG. 6A, the display substrate further includes an insulating layer 010 located on the base substrate 100. The first crack stopper 101a is configured to block the first crack CRKa in the insulating layer 010 from extending to the display region 1001.

As shown in FIG. 6A, in at least one example, the first crack stopper 101a may include at least one groove 1, and when a plurality of grooves 1 are included, a retaining wall 2 may be formed between adjacent grooves 1. For example, the retaining wall 2 is a portion of the insulating layer located between adjacent grooves 1. In one or more examples, the first crack stopper 101a is formed in the insulating layer 010, for example, it may be formed by etching the insulating layer 010. The etching method includes, for example, dry etching. For example, the groove 1 may be formed in the insulating layer 010 and may partially or completely run through the insulating layer 010 in a direction perpendicular to the base substrate 100. The insulating layer 010 may include at least one sub-layer. In one or more examples, the first crack stopper 101a includes at least one of a groove 1 formed in at least a portion of the insulating layer 010 or a retaining wall 2 formed by a portion of the insulating layer 010. In one or more examples, the insulating layer 010 includes a plurality of sub-insulating layers including at least one of the first gate insulating layer 112, the second gate insulating layer 113, and the interlayer insulating layer 114. In at least one example, the groove 1 is located in at least one of the first gate insulating layer 112, the second gate insulating layer 113, and the interlayer insulating layer 114. For the groove 1 and the retaining wall 2, reference may also be made to the previous description, and no further detail will be provided herein. For example, FIG. 5 illustrates two first crack sub-stoppers by the retaining wall 2.

For example, the base substrate 100 may be a flexible base substrate 100, for example, it may be polyimide (PI) to form a flexible display device. The material of the flexible substrate 100 is not limited to polyimide.

As shown in FIG. 6A, in one or more examples, the display substrate further includes a packaging film 020 that is located on the insulating layer 010, i.e., at a side of the insulating layer 010 away from the base substrate 100. The packaging film 020 at least covers the display region 1001 to prevent water and oxygen from invading and damaging the light-emitting element. The light-emitting element includes, for example, but is not limited to, an organic light-emitting diode. For example, the packaging film 020 covers the display region 1001 and a portion of the non-display region 1002 close to the display region 1001, and the second crack stopper 101b is configured to block a second crack CRKb in the packaging film 020 from extending to the display region 1001. For example, the packaging film 020 may be a planar film.

It should be noted that the first crack CRKa and/or the second crack CRKb shown in the figure for a purpose of facilitating understanding may be absent in the actual product. For example, the first crack is located in the insulating layer and the second crack CRKb is located in the packaging film. For example, in some examples, the first crack CRKa may be extended as the second crack CRKb. In some examples, the second crack CRKb may be extended as the first crack CRKa.

As shown in FIG. 6A, in one or more examples, the packaging film 020 includes a first inorganic film 115 and a second inorganic film 116. At a position close to the edge E of the base substrate 100, the first inorganic thin film 115 and the second inorganic thin film 116 are laminated. In the display region 1001, an organic packaging film may be disposed between the first inorganic film 115 and the second inorganic film 116. The packaging film 020 is not limited to include two inorganic packaging films and may be arranged as required.

As shown in FIG. 6A, in one or more examples, the first crack detection line 102a may not be covered by the packaging film 020. For example, the projection of the first crack detection line 102a on the base substrate 100 is outside the projection of the packaging film 020 on the base substrate 100. For example, the first crack detection line 102a may not be covered by the first inorganic packaging film 115 and the second inorganic packaging film 116 of the packaging film 020 which are laminated in contact. For example, in a direction perpendicular to the base substrate 100, the first crack detection line 102a does not overlap with the packaging film 020. For example, in the plan view of the display substrate, the first crack detection line 102a is located outside the packaging film 020. For example, in the plan view of the display substrate, the projection of the first crack detection line 102a on the base substrate 100 is located outside the projection of the packaging film 020 on the base substrate 100.

As shown in FIG. 6A, in one or more examples, in order to facilitate detection of the first crack, the first crack detection line 102a is located between the insulating layer 010 and the base substrate 100. For example, the first crack detection line 102a is located directly below the insulating layer 010, whereby the insulating layer 010 can protect the first crack detection line 102a and prevent the first crack detection line 102a from being corroded by water or oxygen.

Of course, the setting position of the first crack detection line 102a is not limited to this, and the first crack detection line 102a is located directly above the insulating layer 010.

For example, in order to improve detection sensitivity and facilitate the fabrication of the first crack detection line 102a, the first crack detection line 102a is in contact with the insulating layer 010.

For example, in order to improve detection sensitivity and facilitate fabrication of the first crack detection line, when the insulating layer 010 includes a plurality of sub-insulating layers, the first crack detection line 102a may also be located between different sub-insulating layers of the insulating layer 010. For example, it may be located between the first gate insulating layer 112 and the second gate insulating layer 113, or between the second gate insulating layer 113 and the interlayer dielectric layer 114.

Figure 6B:
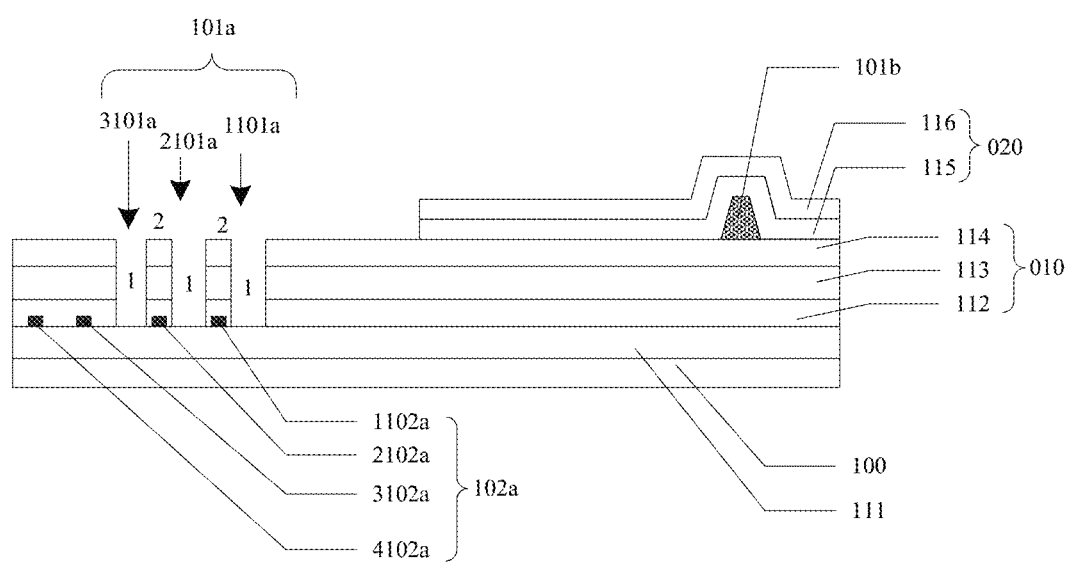
FIG. 6B is a schematic cross-sectional view at MN in FIG. 5.

FIG. 6B is a schematic cross-sectional view at MN in FIG. 5. The second crack stopper 101b is located below the packaging film 020 to facilitate extension of the effective path of water-oxygen invading. For example, the second crack stopper 101b may be covered by the packaging film 020. For example, the second crack stopper 101b may be covered by the packaging film 020 in a direction perpendicular to the base substrate 100. For example, the second crack stopper 101b may be covered by a first inorganic packaging film 115 and a second inorganic packaging film 116 which are laminated in contact. For example, in a direction perpendicular to the base substrate 100, the second crack stopper 101b may overlap with the first inorganic packaging film 115 and the second inorganic packaging film 116 of the packaging film 020 which are laminated in contact. For example, the second crack stopper 101b may be located between the insulating layer 010 and the packaging film 020.

Figure 7:
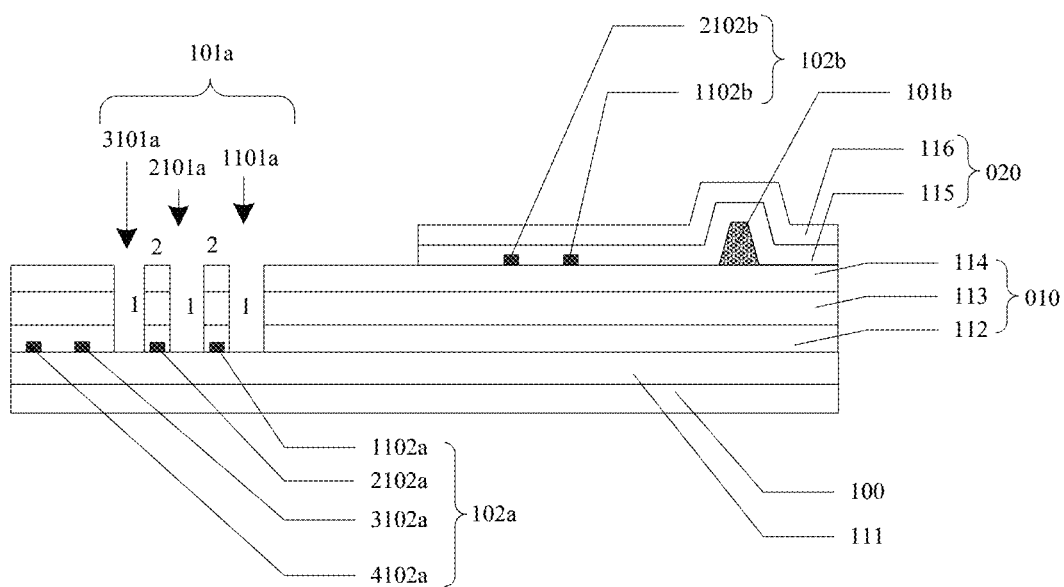
FIG. 7 is a schematic cross-sectional view of a display substrate provided by at least one example of the present disclosure.

FIG. 7 is a schematic cross-sectional view of a display substrate provided by at least one example of the present disclosure. As shown in FIG. 7, the display substrate may further include a second crack detection line 102b. The second crack detection line 102b is located in the non-display region 1002. The second crack detection line 102b may be located between the first crack stopper 101a and the second crack stopper 101b. In other words, the orthographic projection of the second crack detection line on the base substrate is located between the orthographic projection of the first crack stopper on the base substrate and the orthographic projection of the second crack stopper on the base substrate. The second crack detection line 102b may be matched with the first crack detection line 102a to realize graded detection of crack severity. For example, when a crack extends to a crack detection line, the crack detection line will be broken, and whether a crack exists may be known by detecting the resistance of the crack detection line. It should be noted that the method of crack detection is not limited to the method described above. For example, the crack detection line closer to the edge of the display substrate detects a crack, the smaller the crack level and the smaller the crack degree, and the crack detection line farther from edge of the display substrate detects a crack, the larger the crack level and the greater the crack degree. The crack detection line may include a first crack detection line and a second crack detection line, and correspondingly, the crack may include a first crack and a second crack.

As shown in FIG. 7, in one or more examples, the second crack detection line 102b includes a plurality of second crack sub-detection lines insulated from each other. FIG. 7 illustrates two second crack sub-detection lines 1102b and a second crack detection line 2102b.

As shown in FIG. 7, in one or more examples, the second crack detection line 102b may be covered by the packaging film 020. For example, the second crack detection line 102b may be covered by a first inorganic packaging film 115 and a second inorganic packaging film 116 which are laminated in contact. For example, in a direction perpendicular to the base substrate 100, the second crack detection line 102b overlaps with the packaging film 020. Further, for example, in a direction perpendicular to the base substrate 100, the second crack detection line 102b may overlap with the first inorganic packaging film 115 and the second inorganic packaging film 116 of the packaging film 020 which are laminated in contact. When a first crack detection line 102a is provided at a side of the first crack stopper 101a away from the display region and directly below the first crack stopper 101a, and a second crack detection line 102b is provided between the first crack stopper 101a and the second crack stopper 101b, it is more favorable for grading detection of crack severity.

In the examples of the present disclosure, covering, for example, refers to the relationship between the two described elements in a direction perpendicular to the base substrate. There is no restriction on whether the two elements are in contact. For example, the two elements may not be in contact with each other; of course, the two elements may also be in contact with each other.

As shown in FIG. 7, in one or more examples, the second crack detection line 102b is located between the insulating layer 010 and the packaging film 020. For example, in order to improve detection sensitivity and facilitate fabrication of the second crack detection line 102b, the second crack detection line 102b is in contact with the packaging film 020. Of course, the setting position of the second crack detection line 102b is not limited to this. For example, in order to improve detection sensitivity and facilitate fabrication of the second crack detection line 102b, the second crack detection line 102b may be located between different sub-layers of the packaging film 020. For example, the second crack detection line 102b may also be located between the first inorganic packaging film 115 and the second inorganic packaging film 116.

Figure 8A:
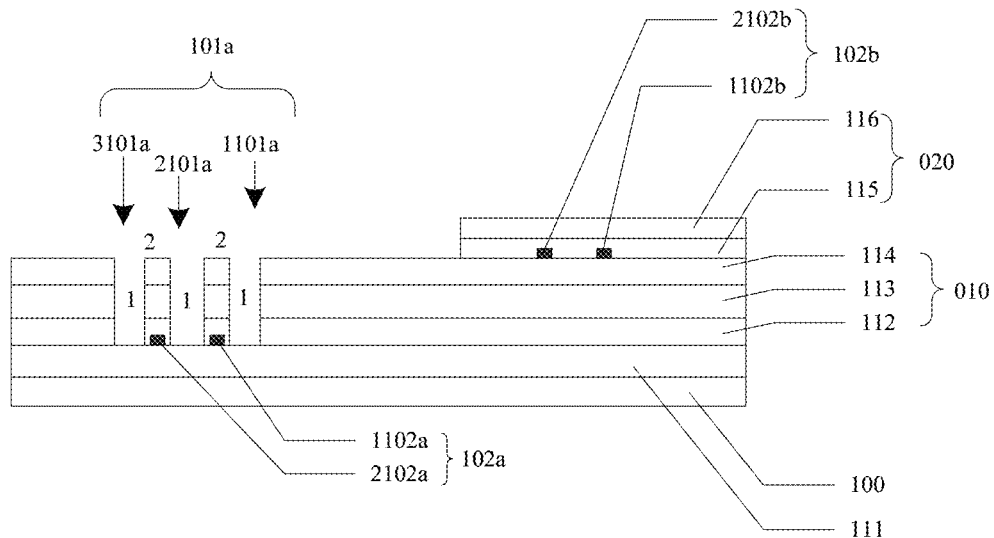
FIG. 8A is a schematic cross-sectional view of a display substrate provided by at least one example of the present disclosure.

FIG. 8A is a schematic cross-sectional view of a display substrate provided by at least one example of the present disclosure. In this display substrate, the first crack detection line 102a is provided only directly below the first crack stopper 101a, that is, the orthographic projection of the first crack detection line 102a on the base substrate 100 falls into the orthographic projection of the first crack stopper 101a on the base substrate 100. For example, in order to better protect the first crack detection line 102a, the first crack detection line 102a may be disposed directly below the retaining wall 2 in the first crack stopper 101a. For example, the first crack detection line 102a is provided only directly below the retaining wall 2 in the first crack stopper 101a.

Figure 8B:
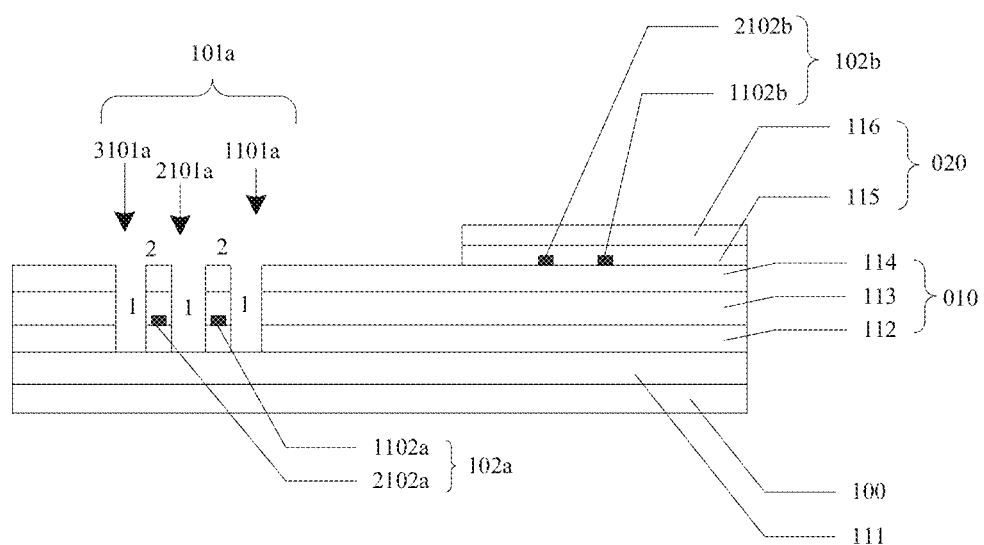
FIG. 8B is a schematic cross-sectional view of a display substrate provided by an example of the present disclosure.

FIG. 8B is a schematic cross-sectional view of a display substrate provided by an example of the present disclosure. For example, the first crack detection line 102a is located between the first gate insulating layer 112 and the second gate insulating layer 113. Of course, the first crack detection line 102a may also be located between the second gate insulating layer 113 and the interlayer dielectric layer 114. In the examples of the present disclosure, the first crack detection line 102a may be located between adjacent sub-layers of the first crack stopper 101a.

Figure 9A:
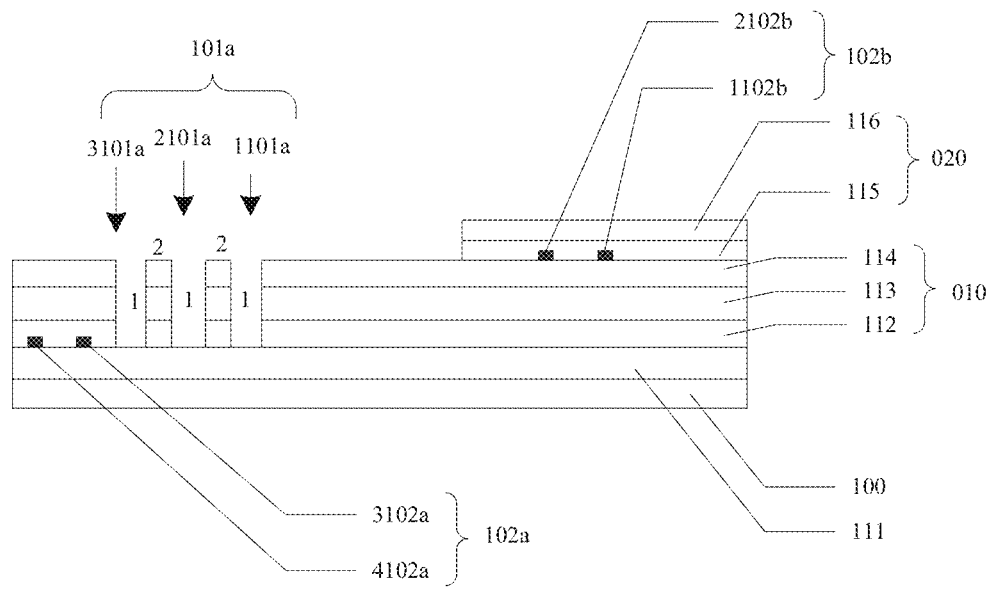
FIG. 9A is a schematic cross-sectional view of a display substrate provided by at least one example of the present disclosure.

FIG. 9A is a schematic cross-sectional view of a display substrate provided by at least one example of the present disclosure. In this display substrate, a first crack detection line 102a is provided only at a side of the first crack stopper 101a away from the display region 1001, and a first crack detection line 102a is not provided directly below the first crack stopper 101a.

Figure 9B:
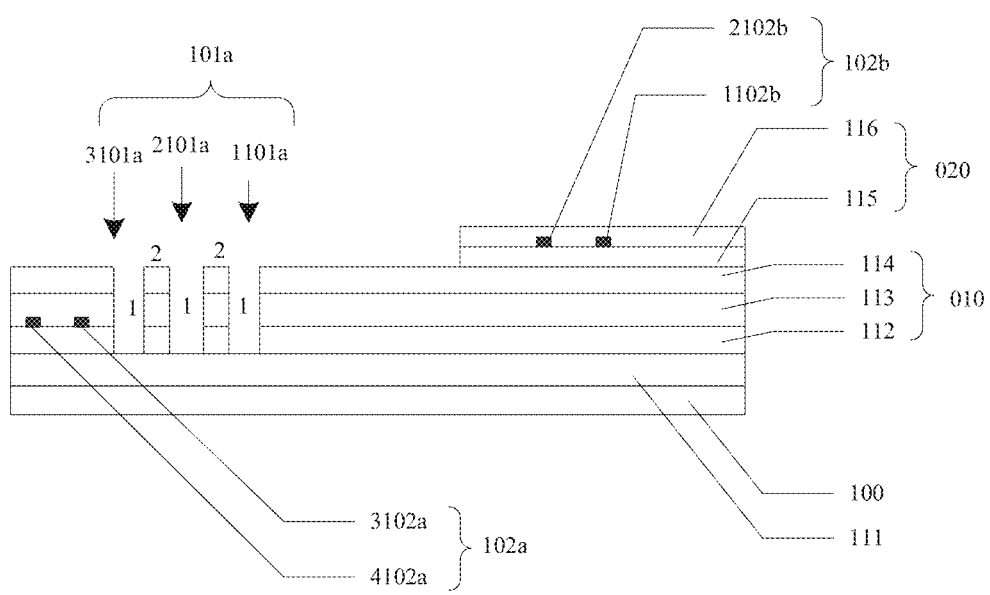
FIG. 9B is a schematic cross-sectional view of a display substrate provided by an example of the present disclosure.

FIG. 9B is a schematic cross-sectional view of a display substrate provided by at least one example of the present disclosure. Compared with the example shown in FIG. 9A, the position of the first crack detection line 102a in a direction perpendicular to the base substrate 100 is adjusted to be located between the first gate insulating layer 112 and the second gate insulating layer 113, and the position of the second crack detection line 102b in a direction perpendicular to the base substrate 100 is adjusted to be located between the first inorganic film 115 and the second inorganic film 116.

In the examples of the present disclosure, the positions of the first crack detection line 102a and/or the second crack detection line 102b in a direction perpendicular to the base substrate 100 may be adjusted as required. For example, the first crack detection line 102a may be located below the insulating layer 010 or between different sub-layers of the insulating layer 010. The second crack detection line 102b may be located below the packaging film 020 or between different sub-layers of the packaging film 020.

In the examples of the present disclosure, the positions of the first crack stopper 101a, the second crack stopper 101b, the first crack detection line 102a, and the second crack detection line 102b are all described as located at the same side of the display region 1001.

Figure 10:
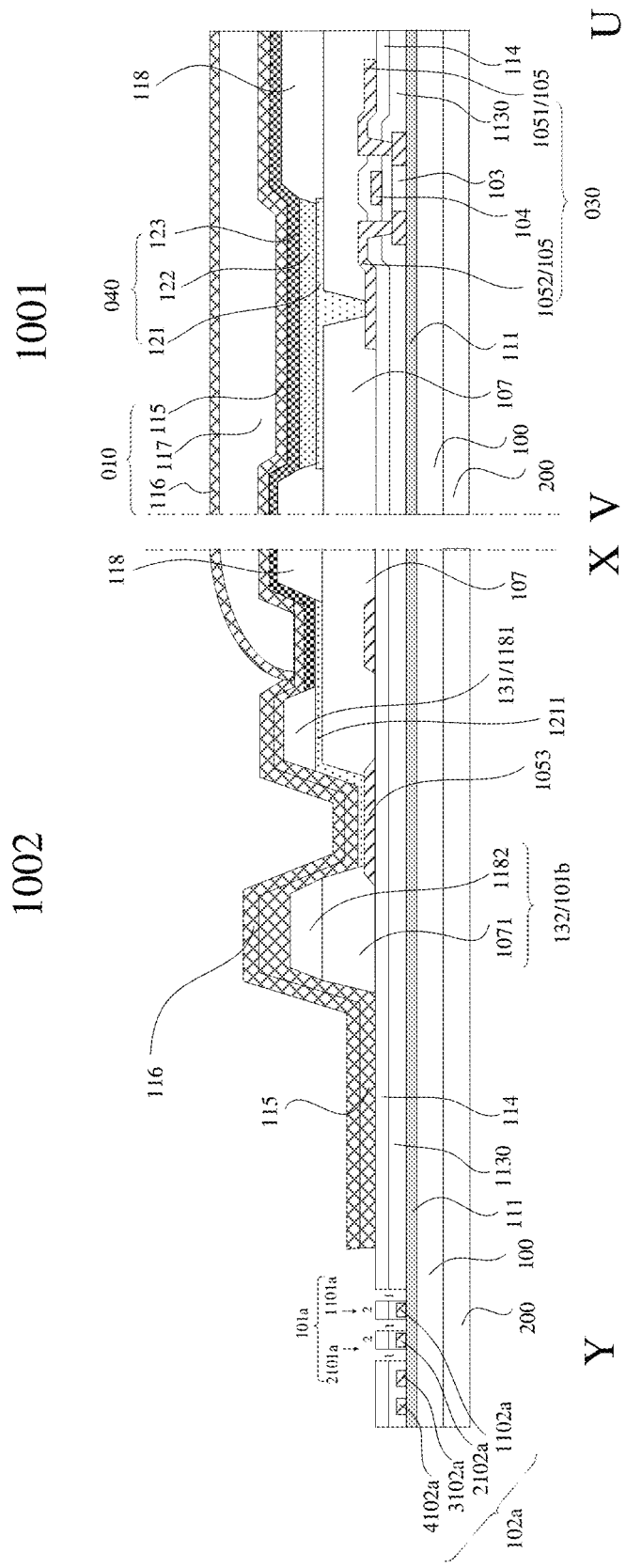
FIG. 10 is a schematic cross-sectional view of a display substrate provided by at least one example of the present disclosure (which may be schematic cross-sectional views at UV and XY in FIG. 4).

FIG. 10 is a schematic cross-sectional view of a display substrate provided by at least one example of the present disclosure. A base substrate 100 is disposed on a support substrate 200, the base substrate 100 may be a flexible substrate, for example, polyimide (PI), but is not limited thereto. The support substrate 200 may be a glass substrate. For example, the support substrate 200 may be removed after the display substrate has been manufactured. A thin film transistor (TFT) array may be provided on the base substrate 100, and only one thin film transistor 030 is shown in FIG. 10. The thin film transistor 030 may include a semiconductor layer, a gate electrode, a gate insulating layer, a source electrode, a drain electrode, and the like.

As shown in FIG. 10, a buffer layer 111, a semiconductor layer 103, a gate insulating layer 1130, a gate electrode 104, an interlayer dielectric layer 114, and a source-drain layer 105 may be sequentially disposed on the base substrate 100, wherein the source-drain layer 105 includes a source electrode 1051 and a drain electrode 1052, which are spaced apart from each other and may be connected to the semiconductor layer 103 through via holes, respectively. A planarization layer 107 may be provided on the thin film transistor 030 and a light-emitting element 040 may be provided on the planarization layer 107, wherein the light-emitting element 040 may include a first electrode 121, a light-emitting functional layer 122, and a second electrode 123. The first electrode 121 may be electrically connected to the drain electrode 1052 through a via hole running through the planarization layer 107. The pixel defining layer 118 may be disposed on the first electrode 121 to facilitate formation of the light-emitting functional layer 122. The second electrode 123 may be electrically connected to an electrode lead 1053 through a connection electrode 1211. The light-emitting functional layer 122 may include a light-emitting layer, and may also include other functional layers, for example, at least one of a hole injection layer, a hole transportation layer, an electron transportation layer, an electron injection layer, and the like, but is not limited thereto. For example, the electrode lead 1053 may be formed in the same layer as the source-drain layer 105. A packaging film 020 may be formed on the light-emitting element 040. The packaging film 020 may be as previously described. The packaging film 020 is covered on the plurality of light-emitting elements 040 to play a protective role. The structure of the light-emitting element 040 is not limited to the above description. FIG. 10 further illustrates an organic packaging film 117 which is located between the first inorganic film 115 and the second inorganic film 116 in the packaging film 020.

FIG. 10 further illustrates a first barrier dam 131 and a second barrier dam 132. The first barrier dam 131 may be formed in the same layer as the pixel defining layer 118, for example, it may be a portion 1181 of the pixel defining layer 118. The second barrier dam 132 may include a first sub-barrier dam 1071 and a second sub-barrier dam 1182 which are laminated. For example, the first sub-barrier 1071 may be formed in the same layer as the planarization layer 117, for example, it may be a portion 1071 of the planarization layer 117. The second sub-barrier dam 1182 may be formed in the same layer as the pixel defining layer 118, for example, it may be a portion 1182 of the pixel defining layer 118.

For example, in one or more examples, the second barrier dam 132 may be a second crack stopper 101b.

For example, the first crack detection line 102a and/or the second crack detection line 102b may be made of a metal material, which may enhance the edge strength of the display substrate. For example, the first crack detection line 102a and/or the second crack detection line 102b may be in a form of a single layer or a plurality of sub-laminated layers, and may be formed of metal materials such as aluminum, molybdenum, or other suitable metal materials. For example, it may be formed by superposing three sub-layers of molybdenum/aluminum/molybdenum in a direction perpendicular to the base substrate, but is not limited thereto.

For example, the first crack detection line 102a and/or the second crack detection line 102b may be fabricated separately or may be formed in the same layer as the metal layer structure in the display region. For example, the first crack detection line 102a and/or the second crack detection line 102b may be formed in the same layer as at least one of the gate electrode 104 and the source-drain layer 105.

For example, in one or more examples, on the basis of the structure shown in FIG. 10, another gate insulating layer may be further included, that is, a first gate insulating layer and a second gate insulating layer are formed.

For example, in one or more examples, the insulating layer 030 may be formed by a high temperature film forming process. For example, at least one of the gate insulating layer 1130 (the first gate insulating layer and the second gate insulating layer) and the interlayer dielectric layer 114 may be formed by a high temperature film forming process.

For example, in one or more examples, the planarization layer 107 and/or the pixel defining layer 118 may be formed of an organic material.

At least one example of the present disclosure further provides a method of manufacturing a display substrate, comprising: forming an insulating layer on a base substrate, wherein the base substrate comprises a display region and a non-display region that is located at at least one side of the display region; and forming a first crack stopper in the non-display region, the first crack stopper being configured to block the first crack in the insulating layer from extending towards the display region; forming a first crack detection line in the non-display region, the first crack detection line is located at a position of at least one of at a side of the first crack stopper away from the display region and directly below the first crack stopper, that is, an edge of the orthographic projection of the first crack stopper on the base substrate close to the display region is a blocking edge, and the orthographic projection of the first crack detection line on the base substrate is located at a side of an orthographic projection of the first crack stopper on the base substrate away from the blocking edge.

At least one example of the present disclosure further provides a detection method of a display substrate, comprising: detecting whether there is a first crack in the display substrate through a first crack detection line.

At least one example of the present disclosure further provides another detection method of a display substrate, comprising: detecting whether there is a first crack in the display substrate through a first crack detection line, detecting whether there is a second crack in the display substrate through a second crack detection line, and grading the crack degree of the display substrate by detection results of the first crack and the second crack.

For example, in the detection method provided by one example, the first crack detection line includes a plurality of first crack sub-detection lines insulated from each other, wherein one portion of the plurality of first crack sub-detection lines is located at a side of the first crack stopper away from the display region, an orthographic projection of another portion of the plurality of first crack sub-detection lines on the base substrate falls into an orthographic projection of the first crack stopper on the base substrate, and the degree of extension of the first crack can be obtained by detecting whether there is the first crack in the display substrate through the plurality of first crack sub-detection lines.

For example, the plurality of first crack detection lines include at least two first crack sub-detection lines respectively located at a side of the first crack stopper away from the display region and directly below the first crack stopper; the degree of extension of the first crack can be obtained by detecting whether there is the first crack in the display substrate through the at least two first crack sub-detection lines.

At least one example of the present disclosure further provides a display device including any one of the above display substrates.

For example, the display device may be a display device such as an OLED or the like, or any product or component with a display function such as a television, a digital camera, a cellphone, a watch, a tablet PC, a laptop, a navigator or the like including such a display device.

It should be noted that, for the sake of clarity, the thickness of layers or regions is zoomed in in the drawings for describing examples of the present disclosure. It will be understood that when an element such as a layer, film, region or substrate is referred to as being "on" or "under" another element, the element may be "directly" "on" or "under" the other element, or intermediate elements may be present.

Without conflict, features in the same example and different examples of the present disclosure may be combined with each other.

The above description is only a specific embodiment of the present disclosure, but the scope of protection of the present disclosure is not limited thereto. Any person of skill familiar with the technical field can easily think of that changes or substitutions within the technical scope disclosed by the present disclosure should be covered within the scope of protection of the present disclosure. Therefore, the scope of protection of the present disclosure should be based on the scope of protection of the claims.

What is claimed is:

1. A display substrate, comprising:
a base substrate, including a display region and a non-display region, the non-display region being located at at least one side of the display region;
an insulating layer, located on the base substrate;
a first crack stopper, located in the non-display region and configured to block a first crack in the insulating layer from extending towards the display region; and
a first crack detection line, located in the non-display region,
wherein an edge of an orthographic projection of the first crack stopper on the base substrate close to the display region is a blocking edge, and an orthographic projection of the first crack detection line on the base substrate is located at a side of an orthographic projection of the first crack stopper on the base substrate away from the blocking edge,
wherein the first crack stopper is formed in the insulating layer,
the first crack stopper comprises at least one groove running through at least a portion of the insulating layer in a direction perpendicular to the base substrate,
the first crack stopper comprises a plurality of grooves, and the first crack stopper further comprises a retaining wall located between adjacent grooves,
all of the first crack detection line is located between the portion of the insulating layer which is penetrated by the groove and the base substrate.

2. The display substrate according to claim 1, wherein the first crack detection line is located at a position of at least one of at a side of the first crack stopper away from the display region and directly below the first crack stopper.

3. The display substrate according to claim 1, wherein the first crack detection line comprises a plurality of first crack sub-detection lines insulated from each other.

4. The display substrate according to claim 3, wherein a portion of the plurality of first crack sub-detection lines is located at the side of the first crack stopper away from the display region, and an orthographic projection of another portion of the plurality of first crack sub-detection lines on the base substrate falls into an orthographic projection of the first crack stopper on the base substrate.

5. The display substrate according to claim 3, wherein the plurality of first crack sub-detection lines are located at a side of the first crack stopper away from the display region.

6. The display substrate according to claim 3, wherein an orthographic projection of the plurality of first crack sub-detection lines on the base substrate falls into an orthographic projection of the first crack stopper on the base substrate.

7. The display substrate according to claim 3, wherein an orthographic projection of the first crack sub-detection lines on the base substrate falls into an orthographic projection of the retaining wall on the base substrate.

8. The display substrate according to claim 3, wherein the first crack sub-detection lines is located between the insulating layer and the base substrate.

9. The display substrate according to claim 3, wherein the insulating layer comprises a plurality of sub-insulating layers, and the first crack sub-detection lines is located between the plurality of sub-insulating layers;
wherein the plurality of sub-insulating layers comprise at least one of a first gate insulating layer, a second gate insulating layer, and an interlayer insulating layer.

10. The display substrate according to claim 1, wherein the first crack detection line is in contact with the insulating layer.

11. The display substrate according to claim 1, further comprising a packaging film and a second crack stopper, wherein the second crack stopper is located in the non-display region, the packaging film is located at a side of the insulating layer away from the base substrate and at least covers the display region, the second crack stopper is configured to block a second crack in the packaging film from extending towards the display region, and the second crack stopper is located at a side of the first crack stopper close to the display region.

12. The display substrate according to claim 11, further comprising a second crack detection line, wherein an orthographic projection of the second crack detection line on the base substrate is located between an orthographic projection of the first crack stopper on the base substrate and an orthographic projection of the second crack stopper on the base substrate.

13. The display substrate according to claim 12, wherein the second crack detection line is located between the packaging film and the insulating layer; or,
wherein the second crack detection line is covered by the packaging film.

14. The display substrate according to claim 12, wherein the second crack detection line comprises a plurality of second crack sub-detection lines insulated from each other, and the second crack detection line is in contact with the packaging film.

15. The display substrate according to claim 12, wherein the packaging film comprises a plurality of sub-packaging films, and the second crack detection line is located between the plurality of sub-packaging films.

16. The display substrate according to claim 11, wherein at least one of the first crack detection line and the first crack stopper is not covered by the packaging film.

17. A display device, comprising the display substrate according to claim 1.

* * * * *